United States Patent [19]

Ishii et al.

[11] 4,405,932
[45] Sep. 20, 1983

[54] PUNCH THROUGH REFERENCE DIODE

[75] Inventors: Kiyoichi Ishii, Ohme; Hideharu Fujii, Yamanashi; Kenji Kobayashi, Koufu, all of Japan

[73] Assignees: Hitachi, Ltd.; Hitachi Microcomputer Engineering, Ltd., both of Tokyo, Japan

[21] Appl. No.: 220,974

[22] Filed: Dec. 29, 1980

[30] Foreign Application Priority Data

Dec. 26, 1979 [JP] Japan ............................ 54-168395

[51] Int. Cl.$^3$ ............................................. H01L 29/90
[52] U.S. Cl. ..................................... 357/13; 357/86; 357/28; 357/90
[58] Field of Search ............... 357/13, 86, 28, 90

[56] References Cited

U.S. PATENT DOCUMENTS 3,856,578 12/1974 Payne ................................. 357/90
4,080,616 3/1978 Horie .................................. 357/13
4,136,353 1/1979 Polinsky ............................. 357/90

*Primary Examiner*—Martin H. Edlow
*Attorney, Agent, or Firm*—Antonelli, Terry & Wands

[57] ABSTRACT

This invention is directed to a punch-through reference diode comprising a first semiconductor region of a first conductivity type which is formed within a semiconductor body; a second semiconductor region of a second conductivity type which is formed within the semiconductor body, the second semiconductor region adjoining the first semiconductor region and defining a first PN-junction with the first semiconductor region; and a third semiconductor region of the first conductivity type which is formed within the semiconductor body, the third semiconductor region adjoining the second semiconductor region and defining a second PN-junction with the second semiconductor region, whereby the second semiconductor region is located between the first PN-junction and the second PN-junction. The diode is characterized in that the second semiconductor region has an impurity concentration distribution in which a concentration of an impurity of the second conductivity type increases from the first PN-junction towards the second PN-junction; that the first and second semiconductor regions are provided with a connection for electrically connecting them in order to short the first PN-junction; and that the first and third semiconductor regions are respectively provided with connections for supplying a voltage so as to reverse-bias the second PN-junction.

19 Claims, 26 Drawing Figures

4,405,932

PUNCH THROUGH REFERENCE DIODE

BACKGROUND OF THE INVENTION

This invention relates to a punch-through reference diode, and more particularly to a diode structure capable of preventing the fluctuations of a punch-through voltage and the occurrence of a negative resistance.

Conventional reference diodes utilize the Zener breakdown gain constant voltage characteristics by exploiting the backward characteristics of semiconductor PN-junctions. In a range of low voltages of, for example, below 6 V, however, the operating resistance becomes very great (for example, $R_d = 1.5 k\Omega$) in a region of several hundred mA, which has led to the disadvantage that constant voltage characteristics, which are sought, are not attained.

As a device which eliminates this disadvantage, there has been developed a punch-through reference diode which exploits the punch-through effect across the emitter region and collector region of a transistor.

The punch-through reference diode is disclosed in, for example, Japanese Published Unexamined Patent Applications Nos. 49-1183, 53-6582 and 54-14689. The devices shown there make use of an npn-type planar transistor, the collector-base junction of which is punched through in such a way that a reverse bias voltage exceeding a punch-through voltage is applied thereto with the emitter region and base region of the transistor shorted. At this time, the breakdown voltage of the collector-base junction is of course greater than the punch-through voltage.

To be noted in these examples is, in the first place, that the emitter region and base region of the planar transistor are shorted. In the second place, the impurity concentration distribution of the base region is flat, or it has a gradient according to which the impurity concentration is high on the base-emitter junction side and gradually lowers towards the collector-base junction side. That is, the impurity concentration distribution of the base region exhibits such a gradient that the impurity concentration on the shorted junction side is high and that the impurity concentration on the junction side to which the reverse bias voltage is applied is low.

Such prior-art reference diodes have had the disadvantage that, in a region of voltages of above 4 V, abrupt constant-voltage characteristics are not achieved because of the occurrence of a negative resistance. A further disadvantage is that, in a region of currents of below 1 mA, constant voltage characteristics are not attained, so they cannot be used as reference diodes.

SUMMARY OF THE INVENTION

This invention has been made in order to solve the problems described above, and has for its object to provide a reference diode which executes a punch-through operation in a broad voltage region and which is free from negative resistance characteristics.

Another object of this invention is to provide a reference diode which can attain constant voltage characteristics in a low current range of from several pA to several mA.

According to this invention, a punch-through reference diode which has a first region and a third region of a first conductivity type, and a second region of a second conductivity type held between the first-mentioned two regions and defining PN-junctions with them respectively is characterized in that the PN-junction defined by at least two adjacent regions among the three regions is shorted.

Further, according to this invention, the second region has such an impurity concentration distribution that an impurity concentration becomes higher from the side of the shorted PN-junction towards the side of the other junction not shorted.

The above-mentioned and other objects of this invention and advantages thereof will be more apparent from the following description of this invention taken with reference to the drawings.

DESCRIPTION OF THE PREFERRED EMBODIMENTS

Figure 1:
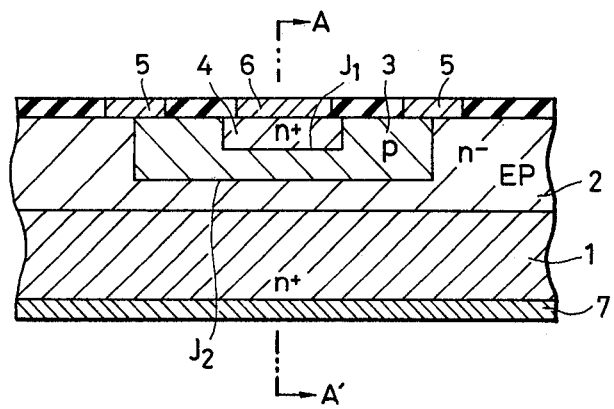
FIG. 1 is a sectional view of a punch-through reference diode according to this invention.

FIG. 1 shows a sectional view of a punch-through reference diode according to this invention.

Figure 3:
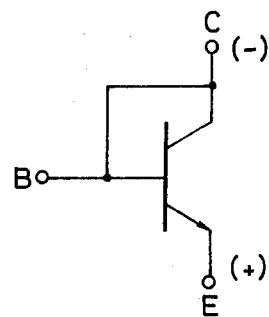
FIG. 3 shows an equivalent circuit of the punch-through reference diode in FIG. 1.

Referring to FIG. 1, a semiconductor body is constructed of an n+-type semiconductor substrate of silicon 1 which constitutes the collector of a planar transistor, an n−-type epitaxial layer 2 which is formed on the substrate and which also constitutes the collector, a p-type base region 3 which is selectively diffused from the surface of the epitaxial layer, and an n+-type emitter region 4 which is formed in a part of the base region. An electrode of a gold-antimony alloy 5 which shorts a collector-base junction $J_2$ is formed across the base region and the collector region. A first electrode of the gold-antimony alloy 6 is formed on the emitter region, while a second electrode of the gold-antimony alloy 7 is formed on the rear surface of the semiconductor substrate. The base region 3 and the emitter region 4 are formed in the shapes of circles, and the shorting electrode 5 is formed in the shape of a ring. In this punch-through reference diode, the Zener breakdown voltage of a base-emitter junction $J_1$ is greater than the punch-through voltage across the emitter region and the collector region. Accordingly, the punch-through reference diode effects a punch-through operation by applying a voltage across the first electrode 6 and the second electrode 7 so as to reverse-bias the base-emitter junction $J_1$. An equivalent circuit of the punch-through reference diode is shown in FIG. 3. According to this invention, an impurity concentration distribution within the base region is especially designed so that an impurity concentration may become higher from the shorted collector-base junction towards the emitter-base junction not shorted.

Figure 2:
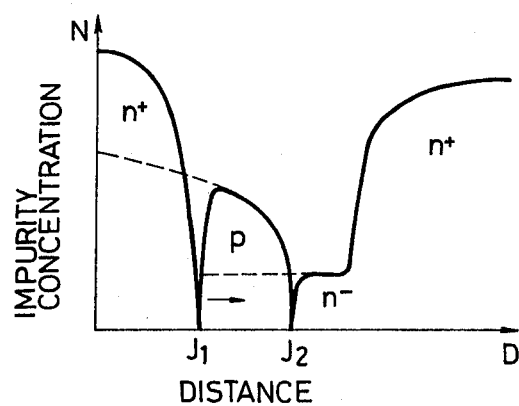
FIG. 2 is a diagram showing an impurity concentration distribution in a section A—A' of the punch-through reference diode shown in FIG. 1.

FIG. 2 shows the impurity concentration distribution in the section A—A' of the punch-through reference diode. The impurity concentration on the shorted collector-base junction side is lower. By way of example, the higher concentration in the base is made $10^{17}$–$10^{18}$ cm$^{-2}$, while the lower concentration is made $10^{15}$–$10^{14}$ cm$^{-2}$. When the reverse bias voltage is applied to the base-emitter junction, a depletion layer spreads in the direction of arrow from the base-emitter junction $J_1$ in the base region. When the reverse bias voltage exceeding the punch-through voltage is applied to the base-emitter junction $J_1$, the depletion layer reaches the collector-base junction $J_2$ from the base-emitter junction $J_1$. That is, the punch-through operation is effected.

In this manner, according to this invention, the base region and the collector region are shorted, and the impurity concentration distribution of the base region is defined so that the impurity concentration on the side of the junction $J_1$ to which the reverse bias voltage is applied may become higher than the impurity concentration on the side of the junction $J_2$ which is formed by the two shorted regions.

Figure 4:
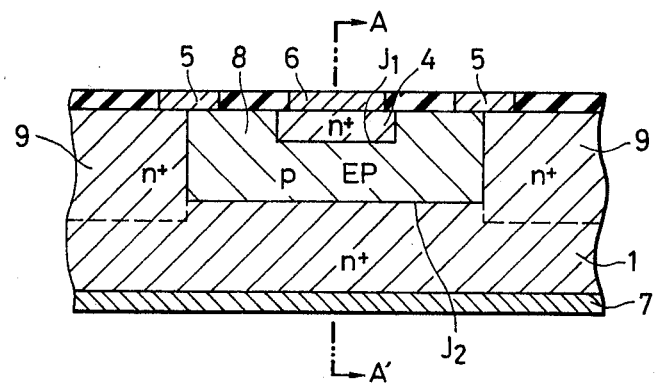
FIG. 4 is a sectional view showing another embodiment of the punch-through reference diode according to this invention.

FIG. 4 shows a second embodiment of the npn-type punch-through reference diode according to this invention. The base region of this diode is especially formed by the use of the epitaxial growth technique. The punch-through reference diode comprises an n+-type semiconductor substrate 1 which serves as the collector of a planar transistor, and a p-type epitaxial layer 8 which serves as the base and which is formed on the substrate by the epitaxial growth technique. The epitaxial layer 8 has a gradient in its impurity concentration. This epitaxial layer is formed with an n+-type region 4 which is the emitter selectively diffused from the surface thereof. Further, a ring-shaped diffused layer 9 which also constitutes the collector is formed in a manner to extend from the surface of the epitaxial layer down to the substrate. Across the base region and the collector region, an electrode 5 for electrically connecting them is formed. A first electrode 6 is formed on the emitter region, while a second electrode 7 is formed on the rear surface of the substrate. Also the equivalent circuit of this diode becomes as shown in FIG. 3.

Figure 5:
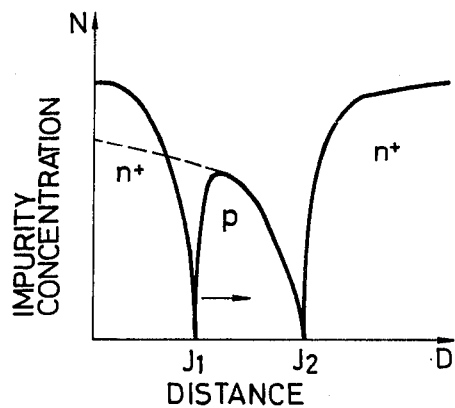
FIG. 5 is a diagram showing an impurity concentration distribution in a section A—A' of the punch-through reference diode in FIG. 4.

FIG. 5 shows the impurity concentration distribution of a section taken along line A—A' in the punch-through reference diode of FIG. 4. An arrow in FIG. 5 indicates the direction in which a depletion layer spreads.

According to the second embodiment, the shorting electrode which shorts the base region and the collector region is formed, and the impurity concentration distribution of the base region formed by the epitaxial layer is defined so that, as in the first embodiment described above, the impurity concentration may become higher from the shorted collector-base junction $J_2$ towards the emitter-base junction $J_1$ not shorted. Likewise to the foregoing diode, this diode is supplied with a voltage across the first electrode 6 and the second electrode 7 so as to reverse-bias the emitter-base junction. Thus, the depletion layer extends from the first junction $J_1$ to the second junction $J_2$.

Figure 6:
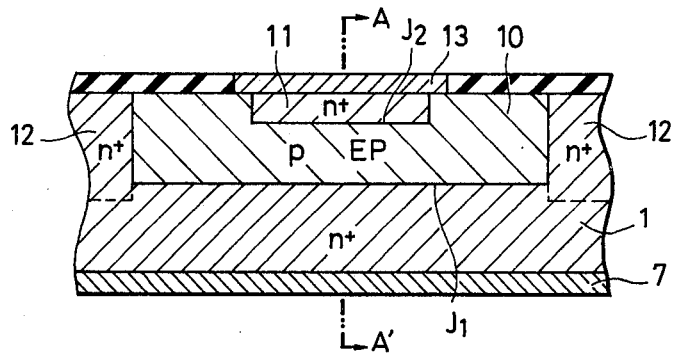
FIG. 6 is a sectional view showing still another embodiment of the punch-through reference diode according to this invention.

FIG. 6 shows a third embodiment of the npn-type punch-through reference diode according to this invention. This punch-through diode utilizes a planar transistor of the so-called inverse type in which the collector of the transistor is formed in the major surface of a semiconductor body. It consists of an n+-type semiconductor substrate 1 which constitutes an emitter, a p-type epitaxial layer 10 which is a base formed on the substrate, an n+-type region 11 which is a collector region selectively diffused from the surface of the epitaxial layer, a diffused layer 12 which is formed in a manner to extend from the surface of the epitaxial layer to the substrate, which encircles the epitaxial layer 10 including the n+-type region 11 and which also constitutes the emitter, a shorting electrode 13 which shorts the collector region and the base region, and a substrate electrode 7 which is formed on the rear surface of the substrate. In this embodiment, a collector-base junction $J_2$ is shorted, while the impurity concentration distribution of the p-type epitaxial layer 10 is defined so that the impurity concentration may lower from an emitter-base junction $J_1$ towards the collector-base junction $J_2$. A voltage is supplied through the electrode 13 and the electrode 7 so as to reverse-bias the emitter-base junction $J_1$, whereby a depletion layer spreads from the emitter-base junction $J_1$ to reach the collector-base junction $J_2$.

Figure 7:
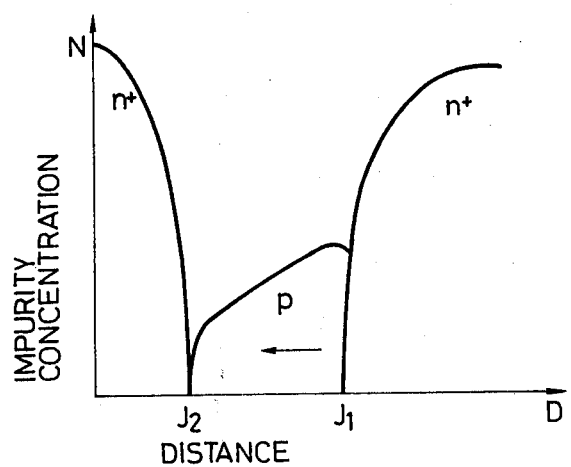
FIG. 7 is a diagram showing an impurity concentration distribution in a section A—A' of the punch-through reference diode in FIG. 6.

FIG. 7 shows the impurity concentration distribution of a section A—A' of the punch-through reference diode shown in FIG. 6. In the punch-through reference diode whose base region has the impurity concentration distribution as shown in FIG. 7, when the reverse bias voltage is applied to the emitter-base junction $J_1$, the depletion layer principally spreads in the direction of arrow from this junction $J_1$.

The features of the third embodiment are that the shorting electrode 13 which shorts the collector region and the base region is disposed, and that the impurity concentration distribution of the base region is such that the impurity concentration on the side of the emitter-base junction $J_1$ to which the reverse bias voltage is applied is higher than the impurity concentration on the side of the collector-base junction $J_2$ which is formed by the shorted two regions.

As understood from the above embodiments, in accordance with this invention, in the punch-through reference diode which utilizes the planar transistor, at least two adjacent regions of the three regions of the transistor are shorted, and the impurity concentration distribution of the base region is defined so that the impurity concentration on the side of the PN-junction formed by the two shorted regions may become lower than the impurity concentration on the side of the other junction, i.e., the junction to which the reverse bias voltage is applied.

The shorting electrode for shorting one PN-junction ($J_2$) prevents the transistor action or transistor effect which is a cause for the occurrence of a negative resistance. More specifically, the negative resistance which is observed in the punch-through reference diode exploiting the planar transistor is considered to develop because the three semiconductor regions in a sandwich structure operate as a transistor. According to this invention, the impurity concentration of the base region is higher on the side of the junction to be reverse-biased ($J_1$) than on the side of the other junction ($J_2$), and besides, the other junction ($J_2$) is short-circuited, so that the transistor action does not take place.

In general, in transistors, $V_{CEO} \approx V_{CBO}/n\sqrt{h_{fe}}$ holds where $V_{CEO}$ denotes a collector-emitter voltage with the base being open, $V_{CBO}$ a collector-base voltage with the emitter being open, $h_{fe}$ a current gain with the emitter being grounded, and n a coefficient. The grounded-emitter d.c. current gain $h_{fe}$ depends upon a collector current $I_{CE}$, and the former increases with the latter. Let's consider a case where the npn-type transistor is brought into the punch-through operation in such a way that, with the collector grounded and the base open-circuited, a voltage is applied across the collector and emitter so as to reverse-bias the base-emitter junction. In this case, $V_{CEO} = V_{CBO}/n\sqrt{h_{fe}}$ holds. Now, when a certain fixed voltage is applied across the collector and emitter, breakdown characteristics are exhibited and the open-base collector current $I_{CEO}$ increases. Accordingly, the current gain $h_{fe}$ increases, and the voltage $V_{CEO}$ across the collector and emitter decreases. In consequence, the negative resistance is observed.

On the other hand, in the punch-through reference diode according to this invention, the base and collector are shorted, so that the transistor action, i.e., the current amplification does not take place. Accordingly, even when the current $I_{CEO}$ flows, it is not amplified, and any fluctuation of the current gain $h_{fe}$ ascribable thereto does not occur, either. This prevents the voltage $V_{CEO}$ from fluctuating and therefore prevents the negative resistance from occurring. Thus, the occurrence of the negative resistance is perfectly prevented, whereby abrupt constant-voltage characteristics can be attained. The prevention of the occurrence of the negative resistance is advantageous in case of producing reference diodes which serve to afford comparatively high constant voltages of at least 4 V. Even when reference diodes for affording comparatively high voltages are produced by making large the base width held between the collector and emitter regions, the occurrence of the negative resistance can be prevented, whereby abrupt constant-voltage characteristics can be gained.

In accordance with the impurity concentration distribution of the base region according to this invention, noise characteristics can be further improved in a current range of several mA to several pA, whereby constant voltage characteristics in the low current region can be attained.

The impurity concentration distribution of the base region of a prior-art punch-through reference diode has been such that an impurity concentration is low on the side of a junction to which a reverse bias voltage is applied and that it becomes higher towards the other junction. In such prior-art punch-through reference diode, when the reverse biase voltage exceeding a punch-through voltage is applied to the collector-base junction, a depletion layer having spread from the collector-base junction reaches the base-emitter junction. That is, a punch-through operation is executed. At this time, minority carriers (electrons) are injected from the emitter region into the base region. The injected minority carriers have the same sign as that of fixed charges in the base region. Since the fixed charges are based on the impurity of the base region, a potential based on the fixed charges is low on the junction side to have the reverse bias applied thereto and is high on the other junction side. Accordingly, the injected minority carriers move from the higher side towards the lower side of the potential based on the fixed charges. Therefore, the injected carriers are further accelerated by the potential, with the result that the degree of scattering of the carriers of the base region increases to form a cause for the development of noise.

In contrast, in the punch-through reference diode according to this invention, as shown in FIGS. 2, 5 and 7, the impurity concentration distribution of the base region is defined so that the impurity concentration may become higher on the junction side to have the reverse bias voltage applied thereto than on the other junction side. That is, the relationship between the junction to have the reverse bias voltage applied thereto and the impurity concentration distribution of the base region is opposite to that in the prior-art punch-through reference diode. Now, the punch-through reference diode of FIG. 2 is taken as an example. When the reverse bias voltage exceeding the punch-through voltage is applied to the base-emitter junction, the depletion layer having spread from the base-emitter junction $J_1$ reaches the collector-base junction $J_2$, that is, the punch-through operation is effected. At this time, electrons are injected from the collector region into the base region. The injected minority carriers in the base region have the same sign as that of fixed charges in the base region. A potential based on the fixed charges is high on the base-emitter junction side and low on the collector-base junction side. Accordingly, the injected carriers move in the direction counter to the potential. For this reason, the flow of the injected carriers is controlled, whereby the scattering of the carriers in the base region is prevented and the carriers move in a substantially constant direction. As a result, the development of noise can be reduced.

Figure 8:
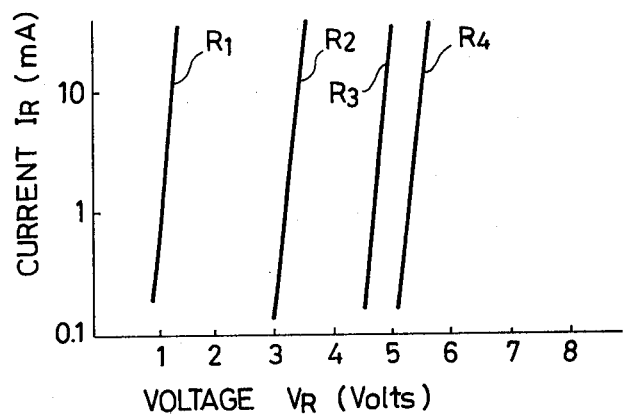
FIG. 8 is a diagram showing constant voltage characteristics of the punch-through reference diode according to this invention.

FIG. 8 shows current ($I_R$)-versus-voltage ($V_R$) characteristics of the reference diode according to this invention. $R_1-R_4$ indicate various samples whose punch-through voltages were controlled by varying the base width.

According to this invention, the punch-through reference diode having the abrupt constant-voltage characteristics in the low current region as shown in FIG. 8 is provided for the reasons described above. That is, according to this invention, even when the current $I_R$ of the diode is in the low current range of several pA—several mA, the voltage $V_R$ of the diode rises abruptly, and good constant-voltage characteristics are provided. In a range of, for example, 1–5 V, the hard waveforms $R_1$–$R_4$ of good rise in which operating resistances $R_d$ are 0.2–0.5 k$\Omega$ can be attained. Further, reference diodes causing no negative resistance can be produced for a punch-through voltage of or above 4 V.

Now, a processor for manufacturing the punch-through reference diode according to this invention as shown in FIG. 1 will be described with reference to FIGS. 9A–9D.

Figure 9A:
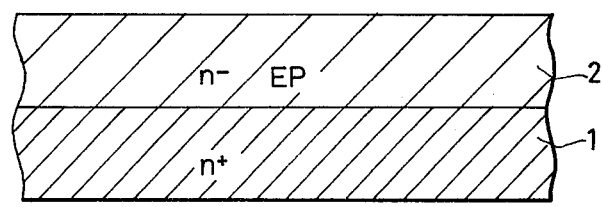
FIGS. 9A to 9D are sectional views in respective steps for explaining a process for manufacturing the punch-through reference diode of FIG. 1.

(A) An n+-type substrate 1 is prepared, on which an n−-type epitaxial layer 2 of the same conductivity type is formed. The impurity concentration distribution of this epitaxial layer is made flat. (FIG. 9A)

Figure 9B:
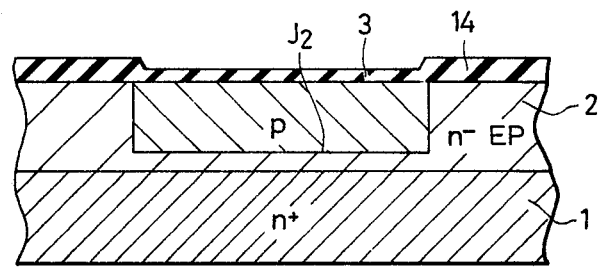

(B) Using an oxide film 14 as a mask, p-type diffusion is carried out into the surface of the n-type epitaxial layer so as to form a p-type base region 3. This p-type base region 3 defines a pn-junction $J_2$ between it and the n−-type epitaxial layer. (FIG. 9B)

Figure 9C:
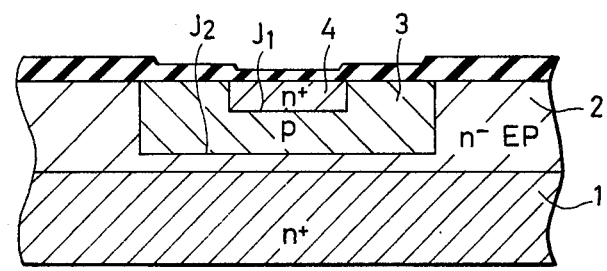

(C) By diffusing an n+-type impurity into the surface of the p-type base region, an n+-type emitter region 4 is formed. A pn-junction $J_1$ is defined between the emitter region and the base region. (FIG. 9C)

Figure 9D:
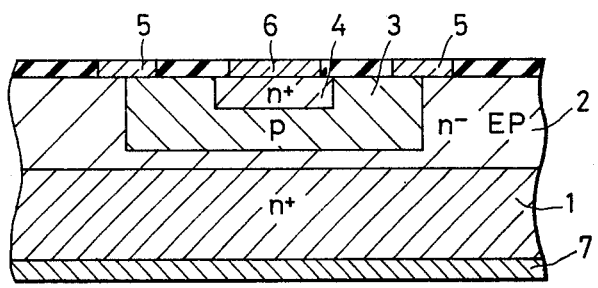

(D) By disposing a shorting electrode 5 on the surface portion of the base-collector junction, the base region and the collector region are shorted. Simultaneously, a substrate electrode 7 is formed. (FIG. 9D)

The impurity concentration distribution of this punch-through reference diode becomes as shown in FIG. 2.

Figure 10A:
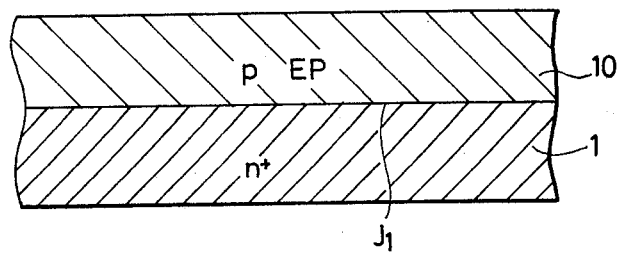
FIGS. 10A to 10C are sectional views in respective steps for explaining a process for manufacturing the punch-through reference diode of FIG. 6.
Figure 10B:
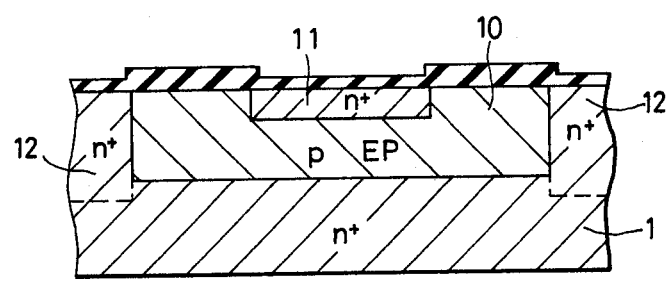
Figure 10C:
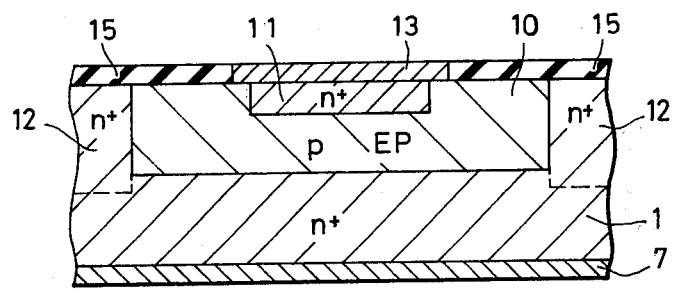

FIGS. 10A–10C illustrate a process for manufacturing the punch-through reference diode of this invention as shown in FIG. 4. This reference diode is produced by the following steps:

(A) An n+-type silicon substrate (starting substrate) 1 is prepared. (FIG. 10A)

(B) A p-type epitaxial layer 10 which serves as a base region is formed on the substrate 1. The impurity concentration distribution of the p-type epitaxial layer (base) is defined so as to have the concentration gradient according to which the impurity concentration is high on the substrate side and low on the surface side as shown in FIG. 5. During the epitaxial growth, by way of example, the quantity of doping with boron of the p-type is gradually reduced from the order of $10^{18}$ cm$^{-2}$ to the order of $10^{15}$ cm$^2$. Alternatively, a non-doped epitaxial layer is formed at first, whereupon the ion implantation of the impurity is performed and the dosage is varied in inverse proportion to the magnitude of implantation energy, whereby the graded concentration higher on the substrate side and lower on the surface side can be established. A pn-junction $J_1$ is formed between the epitaxial layer and the substrate. (FIG. 10A)

(C) In a peripheral portion of the epitaxial layer, n+-type selective diffusion reaching the substrate is carried out to form an isolation portion 12. Subsequently, shallow n+-type diffusion is carried out in a central portion to form an n+-type emitter region 11. A pn-junction $J_2$ is formed between the emitter region and the base region. (FIG. 10B)

(D) That part of an oxide film 15 which corresponds to the surface portion of the junction between the p-type base region and the n+-type emitter region is opened into a window, in which a shorting electrode 13 is disposed thereby to short the base and the emitter. (FIG. 10C)

Figure 11:
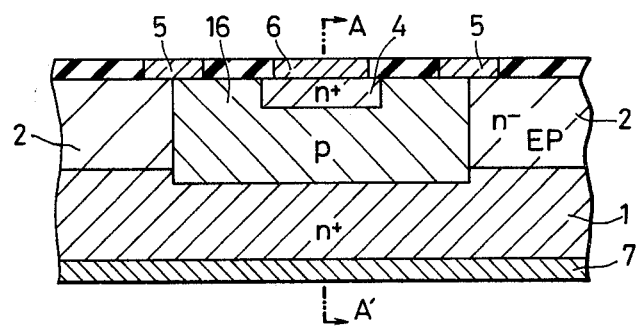
FIG. 11 is a sectional view showing a further embodiment of the punch-through reference diode according to this invention.
Figure 12:
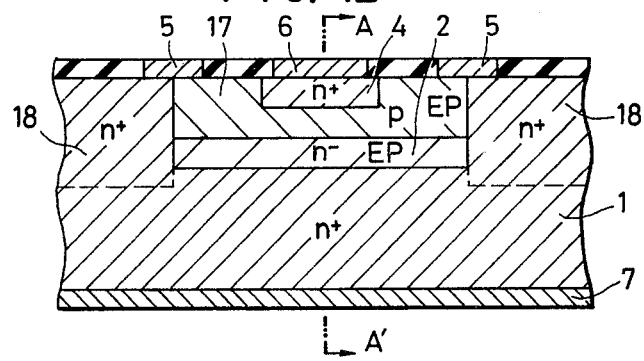
FIG. 12 is a sectional view showing a yet further embodiment of the punch-through reference diode according to this invention.

Further embodiments of this invention are shown in FIGS. 11 and 12.

FIG. 11 illustrates a case where a p-type base region 16 is formed by diffusion so as to reach an n+-type substrate 1, and the other manufacturing steps are the same as in the case of FIGS. 9A–9D. The impurity concentration distribution of a section A—A' in this case becomes similar to that shown in FIG. 5.

FIG. 12 illustrates a case where a p-type epitaxial layer 17 is used as a base region instead of forming the p-type base region by diffusion. In forming the p-type epitaxial layer, the quantity of doping with, for example, boron is gradually reduced during the growth of the epitaxial layer, or alternatively, after forming an epitaxial layer the dosage of an impurity is varied in inverse proportion to the magnitude of implantation energy, whereby the impurity concentration of the base region is made low in a deep part and high in a surface part. The impurity concentration distribution of a section A—A' in this case becomes similar to that shown in FIG. 2. Thereafter, a n+-type diffused region 18 is formed in a peripheral portion of the epitaxial layer in a manner to reach the substrate. The other manufacturing steps are the same as in an embodiment shown in FIG. 14 to be described later.

This invention is not restricted to the embodiments described above. Although the foregoing embodiments have illustrated the npn-junction type, this invention is similarly applicable to the pnp-junction type.

Figure 13:
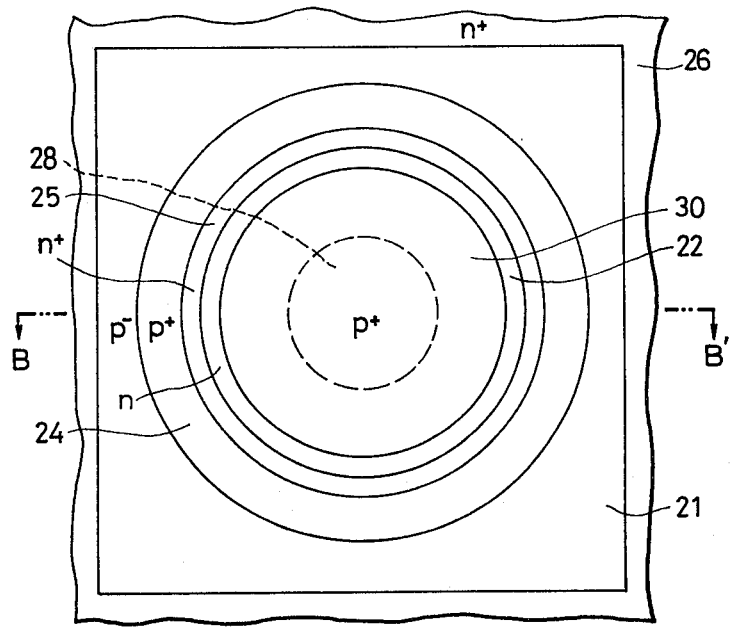
FIG. 13 is a top plan view showing a still further embodiment of the punch-through reference diode according to this invention.
Figure 14:
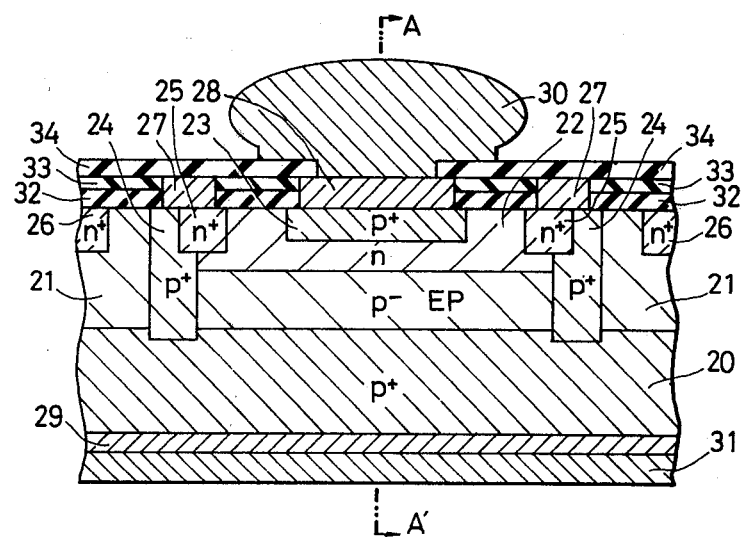
FIG. 14 is a sectional view taken along a line B—B in the punch-through reference diode of FIG. 13.

FIGS. 13 and 14 shown an embodiment of a pnp-type punch-through reference diode according to this invention. FIG. 13 is a top plan view of the embodiment, while FIG. 14 is a sectional view taken along B—B in FIG. 13. This punch-through reference diode utilizes a pnp-type planar transistor. It consists of a silicon semiconductor substrate of the p+-type 20 which serves as a part of a collector region, a silicon epitaxial layer of the p−-type 21 which is formed on the substrate and which forms a part of the collector region, an n-type base region 22 which is selectively formed from the surface of the epitaxial layer, a p+-type emitter region 23 which is formed in a part of the base region, a ring-shaped p+-type region 24 which is formed around the base region so as to reach the substrate, a ring-shaped n+-type region 25 which is formed inside the p+-type region 24 in adjacency thereto, an n+-type isolation layer 26, a shorting electrode 27 which shorts the base region and the collector region, a first electrode 28 for forming a silver bump electrode as is formed on the emitter region, a second electrode 29 for forming a silver electrode as is formed on the rear surface of the substrate, the silver bump electrode 30 which is an anode, the silver electrode 31 which is formed on the second electrode on the rear surface of the substrate and which is a cathode, and an oxide film 32, a phosphorus glass film 33, and a phosphosilicate glass film 34 formed by the chemical vapor deposition technique, all of which serve for insulation. The impurity concentration distribution of the base region is such that an impurity concentration on the side of a shorted junction is low, while an impurity concentration on the side of a junction to have a reverse bias voltage applied thereto is high. Accordingly, the impurity concentration of a section A—A' in this case becomes a distribution with the conductivity types reversed in FIG. 2.

In this punch-through reference diode, the breakdown voltage of the base-emitter junction is set to be greater than the punch-through voltage between the emitter and the collector. Accordingly, the punch-through reference diode effects a punch-through operation in such a way that a voltage exceeding the punch-through voltage as reverse-bias the base-emitter junction is applied across the anode 30 and the cathode 31. At this time, a depletion layer spreads from the base-emitter junction and reaches the collector-base junction in the base region.

This embodiment possesses the features of the present invention, namely, the shorting electrode which shorts the two adjacent regions of the planar transistor, and the impurity concentration distribution of the base region in which the impurity concentration is low on the side of the shorted junction and high on the side of the junction to have the reverse bias voltage applied thereto. Accordingly, the transistor action can be eliminated and the negative resistance can be prevented from occurring by disposing the shorting electrode as already stated. In addition, owing to the specified gradient given to the impurity concentration distribution of the base region, the occurrence of noise due to the scattering of minority carriers injected from the collector region into the base region can be reduced.

This embodiment is accordingly usable as the reference diode in the current range of several pA-several mA. Since it does not give rise to the negative resistance at punch-through voltages of and above 4 V, punch-through reference diodes whose punch-through voltages can be set in a broad range are provided.

Further, this embodiment exploiting the pnp-type planar transistor has been revealed to be more advantageous than the npn-type one in the prevention of noise. Upon the punch-through of this punch-through reference diode, the depletion layer spreads from the base-emitter junction and reaches the collector-base junction in the base region. At this time, holes are injected from the collector region into the base region. The holes have the same sign as that of fixed charges in the base region. Since a potential based on the fixed charges is dependent upon the impurity concentration, the injected holes move contrary to the potential. Therefore, the flow of the injected holes is controlled, and the scattering thereof in the base is controlled. As a result, noise are reduced. Herein, the reason why the injected holes can move contrary to the potential based on the fixed charges of the base region having the same sign is that they are accelerated by an electric field established by the applied voltage. The degree to which they are accelerated by the electric field differs depending upon the kinds of carriers. That is, when the carriers are electrons, the degree of the acceleration is greater than in case of holes. This is because the mobility of electrons is greater than that of holes. According to the present embodiment, the minority carriers which are injected into the base region are holes, and the flow of the holes is effectively controlled by the potential of the same sign owing to the lower degree of acceleration of the holes. Accordingly, the reference diode of the pnp-type according to the present embodiment can lessen the occurrence of noise as compared with the reference diode of the npn-type.

The reference diode of this invention shown in FIGS. 13 and 14 affords a structure which is meritorious in point of a manufacturing process. When the n-type base region is formed by the ion implantation of arsenic (As) and the p$^+$-type emitter region by the ion implantation of boron fluoride (BF$_2$), the width of the base region can be readily controlled, and a lattice distortion in the base-emitter junction to have the reverse bias voltage applied thereto can be diminished.

After the ion implantation of boron fluoride (BF$_2$), stretching diffusion is carried out. Herein, the diffusion coefficient of arsenic (As) is smaller than that of boron (B), so that even when the ion-implanted boron is thermally diffused in order to form the emitter region, the arsenic is scarcely diffused. Owing to the difference of the diffusion coefficients, the width of the base region can be made narrow enough to cause the punch-through, and the base width can be accurately and easily controlled.

By combining the impurities As and B in order to form the base and emitter regions, the lattice distortion in the base-emitter junction face can be diminished. The diminution of the lattice distortion in the junction face makes it possible to reduce leakage current and noise.

The above effects can be similarly achieved in case of forming the emitter region by diffusing B. Even when As is substituted by antimony (Sb), similar effects are achieved. This is because the diffusion coefficient of Sb is sufficiently small in comparison with that of B, and also the combination between Sb and B can lessen the lattice distortion in the junction face.

Figure 15:
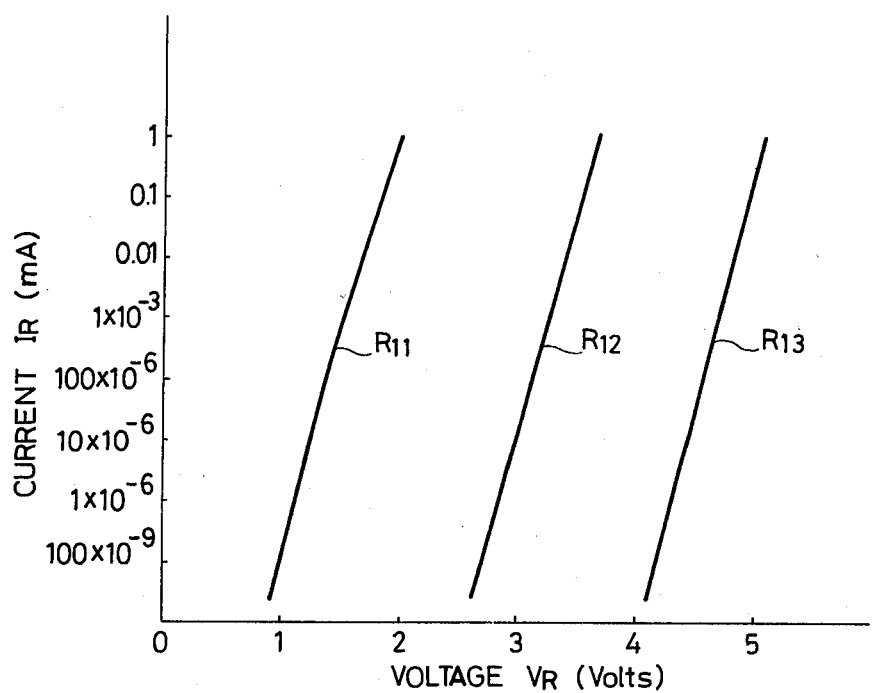
FIG. 15 is a diagram showing constant voltage characteristics of the punch-through reference diode of FIG. 13.

FIG. 15 illustrates current $I_R$-versus-voltage $V_R$ characteristics of the punch-through reference diode of the structure shown in FIGS. 13 and 14. In particular, it illustrates constant voltage characteristics of three punch-through reference diodes $R_{11}R_{13}$ having unequal punch-through voltages. The axis of ordinates represents the current $I_R$ after punch-through in the logarithmic scale, while the axis of abscissas represents the voltage $V_R$ after punch-through. All the reference diodes exhibit linearity in a current range of several pA to several mA and can provide good constant-voltage characteristics. These characteristics indicate that no negative resistance appears even when the punch-through voltage is in excess of 4 V.

The punch-through voltage is not restricted to the three examples in FIG. 15, but it can be set at a predetermined value by adjusting the base width.

Figure 16:
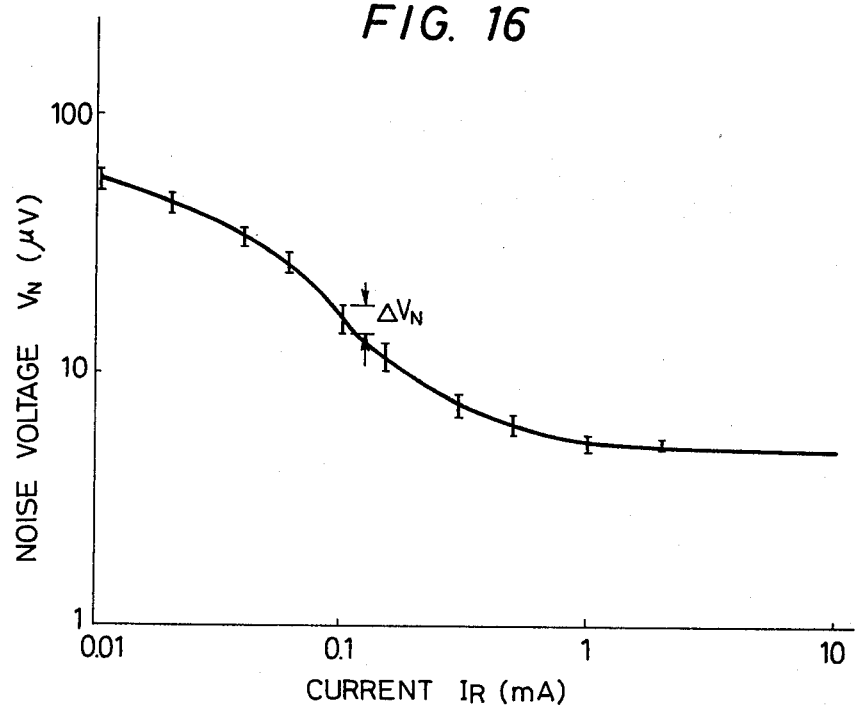
FIG. 16 is a diagram showing noise characteristics of the punch-through reference diode of FIG. 13.

FIG. 16 illustrates noise characteristics of the punch-through reference diode of this invention shown in FIGS. 13 and 14. The axis of ordinates represents a noise voltage $V_N$ in the logarithmic scale, while the axis of abscissas represents a current $I_R$ after punch-through. $\Delta V_N$ denotes a range of dispersions among samples. Noise voltages in the low current range could be reduced to approximately ½ of those in the prior-art reference diodes.

Figure 17:
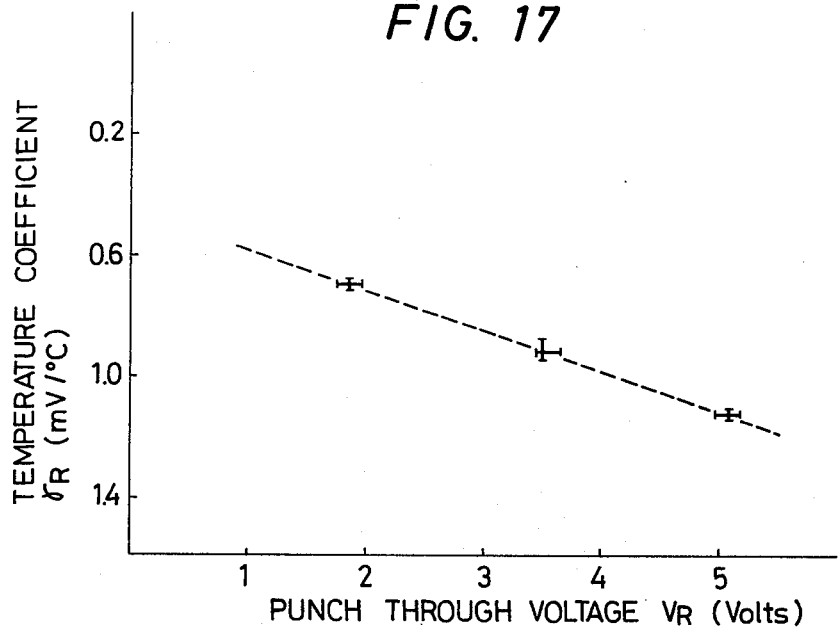
FIG. 17 is a diagram showing temperature compensation characteristics of the punch-through reference diode of FIG. 13.

FIG. 17 illustrates temperature compensation characteristics of the three examples having the different breakdown characteristics shown in FIG. 15, of the punch-through reference diode of this invention shown in FIGS. 13 and 14. The axis of abscissas represents a terminal voltage $V_R$ at the time when the current $I_R$ after punch-through is 0.5 mA, while the axis of ordinates represents as a temperature coefficient $\gamma_R$ (mV/°C.) the rate of variation of the terminal voltage per unit temperature at the time when an ambient temperature is varied from 25° C. to 125° C. with the current $I_R$ after punch-through kept at 0.5 mA. As seen from the figure, the temperature coefficients of the three diodes became approximately −0.7 mV/°C., −0.9 mV/°C. and −1.1 mV/°C. respectively, which could not be attained with the prior-art punch-through reference diodes.

Now, a method of manufacturing the punch-through reference diode of this invention shown in FIGS. 13 and 14 will be described with reference to FIGS. 18A–18C.

Figure 18A:
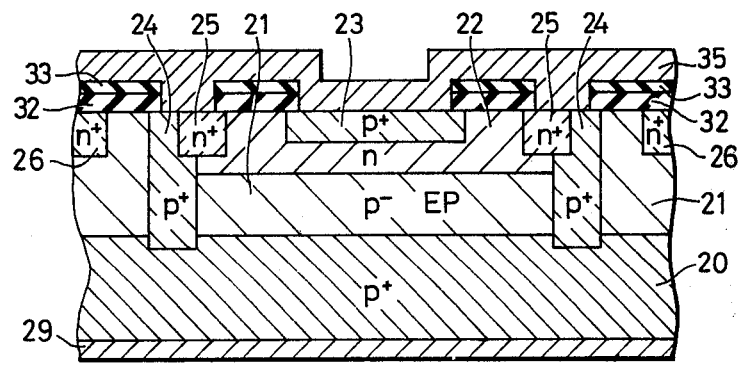
FIGS. 18A to 18C are sectional views in respective steps for explaining a process for manufacturing the punch-through reference diode of FIG. 13.

(A) As shown in FIG. 18A, a $p^-$-type epitaxial layer 21 is grown on a $p^+$-type semiconductor substrate 20, and a $p^+$-type deep diffused layer 24 in the shape of a ring is formed so as to reach the substrate. Subsequently, ions of arsenic (As), for example, are implanted, and the implanted region is subjected to stretching diffusion, to form a base region 22 inside the ring-shaped $p^+$-type diffused layer 24 in contact therewith. At the next step, ions of boron fluoride ($BF_2$), for example, are implanted to form a $p^+$-type emitter region 23. At this time, a ring-shaped $n^+$-type region 25 lying inside and in contact with the ring-shaped $p^+$-type region 24 and a rectangular $n^+$-type region 26 surrounding a diode region are simultaneously formed by the ion implantation of $BF_2$. A silicon dioxide film 32 and a phosphosilicate glass film 33 are formed on the front surface anew, and the surface of the junction portion between the ring-shaped $p^+$-type region 24 and $n^+$-type region 25 and the surface of a part of the emitter region are exposed. Films 35 and 29 of, for example, an Au-Ga alloy are respectively formed on the whole areas of the front and rear surfaces of the resultant semiconductor substrate by the evaporation technique.

Figure 18B:
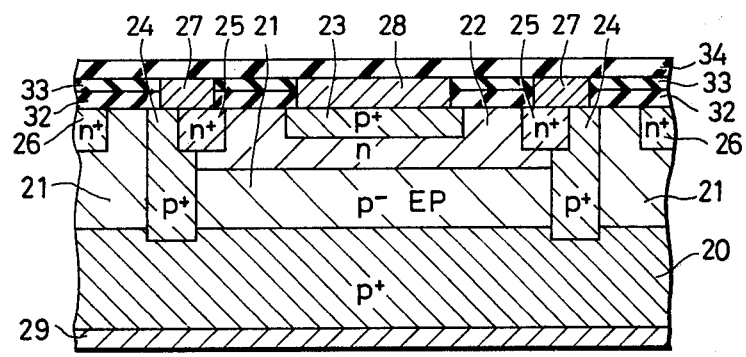

(B) As seen from FIG. 18B, the evaporated Au-Ga film 35 is removed by the etching technique, and after sintering the substrate, a phosphosilicate glass film 34 is formed on the whole front surface by the chemical vapor deposition technique.

Figure 18C:
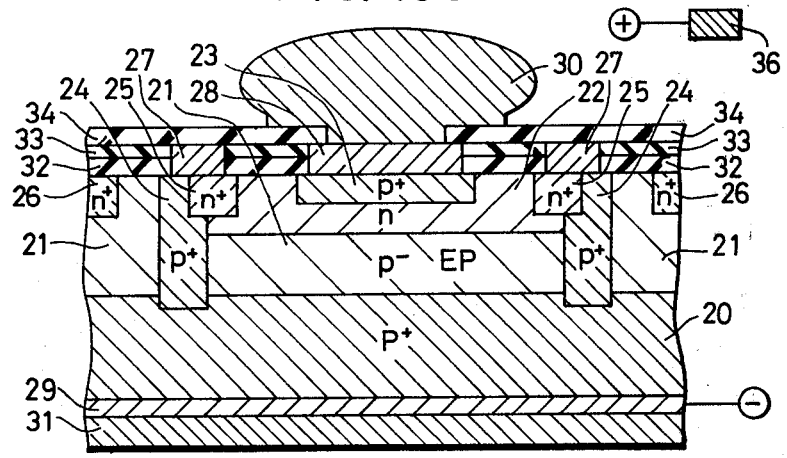

(C) As shown in FIG. 18C, that part of the phosphosilicate glass film 34 which overlies the emitter region is removed by the etching technique so as to expose the an evaporated Au-Ga film 28 on the emitter region. Using the evaporated Au-Ga film 28 as an anode and the evaporated Au-Ga film 29 on the rear surface of the substrate as a cathode, a bump electrode of silver (Ag) 30 is formed on the metal film 28 by electroplating. In the electroplating, an Ag electrode 36 and the silicon wafer to form the element therein are immersed in an electrolyte (not shown) within an identical bath, and the electrode 29 of the silicon wafer and the Ag electrode 36 are respectively connected to the negative pole ⊖ and positive pole ⊕ of a d.c. voltage source.

Subsequently, an Ag layer 31 is formed on the rear surface of the silicon wafer by the evaporation technique.

Although FIGS. 18A–18C have illustrated only one element of the reference diode, it is needless to say that a large number of such elements are simultaneously formed in a single large silicon semiconductor wafer in accordance with the steps described above. The single silicon semiconductor wafer formed with the large number of reference diodes according to this invention is scribed along the rectangular $n^+$-type regions 26 and split into the individual elements (pellets). Each element having the silver bump 30 is finally encapsulated in glass. The glass encapsulation can be achieved with, for example, a technique which is disclosed in Japanese Utility Model Application Publication No. 42-4828 filed by General Electronic Company. According to this technique, the semiconductor pellet and external leads are inserted in a glass sleeve, and one heat-treatment is carried out to mount the external leads on the semiconductor pellet simultaneously with the glass encapsulation.

By the foregoing steps, the large number of punch-through reference diodes according to this invention are formed in the single wafer. Subsequently, the wafer is cut along the central parts of the rectangular $n^+$-type regions 26 into the chips, which are subjected to the DHD type encapsulation. Then, the devices are finished up.

According to the punch-through diode of this invention shown in FIGS. 13 and 14, the following effects can be achieved:

(1) Since the collector region and base region of the pnp-type planar transistor are shorted, the electroplating is easily employed. In particularly, the plating is executed with the pn-junction diode operated in the forward direction, and hence, it is not hindered.

(2) The ring-shaped $n^+$-type region 24 and $p^+$-type region 25 are disposed, and the contact with a shorting electrode 27 is more ohmic. In particular, when the electroplating is employed, the forward resistance is reduced, which contributes to the formation of a uniform bump electrode.

(3) In obtaining the chips, the wafer is cut along the rectangular $n^+$-type regions 26, so that non-conforming articles are difficult to occur. The rectangular $n^+$-type region checks the unfavorable invasion of an impurity into the element forming region.

(4) The Ag bump electrode is formed to be larger than the emitter region and to cover the base-emitter junction, whereby the voltage of surface breakdown can be raised. That is, the depletion layer is controlled by the shape of the Ag bump electrode, and this serves to make the breakdown voltage of the base-emitter junction greater than the punch-through voltage between the emitter region and the collector region.

Figure 19:
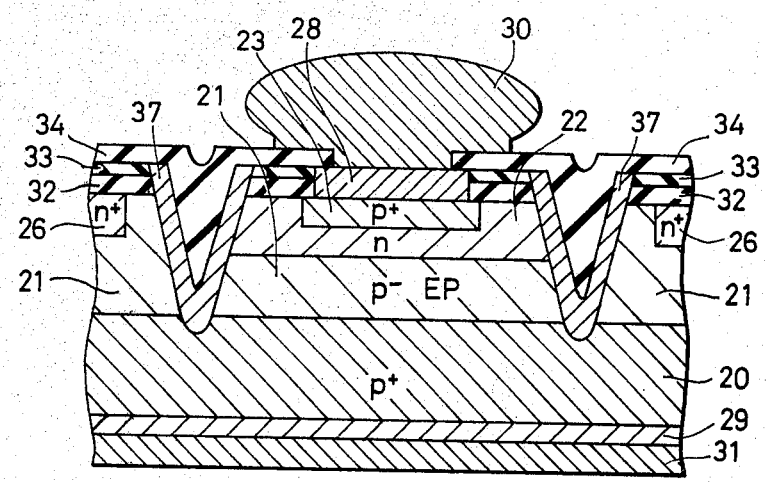
FIG. 19 is a sectional view showing another embodiment of the punch-through reference diode according to this invention.

Instead of disposing the ring-shaped $p^+$-type region 24 and $n^+$-type region 25 for the ohmic contact with the shorting electrode, a V-shaped groove may well be formed in which a shorting electrode is formed. FIG. 19 shows another embodiment of this invention employing the V-shaped groove. Referring to FIG. 19, a base region 22, an emitter region 23 and a rectangular $n^+$-type region 26 are formed in parts of a $p^-$-type epitaxial layer 21 formed on a $p^+$-type substrate 20, and an oxide film 32 and a phosphosilicate glass film 33 are formed on the front surface of the substrate. Subsequently, the V-shaped groove is provided by etching in a part in which the ring-shaped $p^+$-type region and $n^+$-type region are to be formed. The V-shaped groove is formed in contact with the periphery of the base region 22 and in a manner to reach the $p^+$-type substrate 20. In one of the side surfaces of the V-shaped groove, the n-type base region 22, $p^-$-type epitaxial layer 21 and $p^+$-type substrate 20 are exposed. Subsequently, a part of the surface of the emitter region is exposed, and the shorting electrode 37 is formed simultaneously with an emitter electrode 28. The other steps are the same as those explained with reference to FIG. 18C.

In case of adopting the resin mold encapsulation in lieu of the glass encapsulation, the Ag bump electrode can be replaced with an aluminum (Al) electrode. Herein, there is the advantage that no Al barrier is formed owing to the pnp-type.

The punch-through reference diode of FIGS. 13 and 14 have the various advantages stated above, especially the excellent voltage—current characteristics and noise characteristics as well as the small temperature coefficient. It is the most preferable aspect of performance of this invention.

As apparent from the foregoing description of the various embodiments, this invention can bring forth the following properties:

(1) The occurrence of the negative resistance is preventable.

(2) The development of noise can be reduced. In case of adopting the pnp-type, the noise can be reduced more than in the punch-through reference diode exploiting the npn-type planar transistor.

(3) Abrupt breakdown characteristics can be maintained even with current values of several pA.

(4) Temperature compensation characteristics are good.

(5) Voltage—current characteristics are not bidirectional. The voltage-current characteristics in the forward direction are the same as those of conventional diodes.

(6) The operating resistance is low.

I claim:

1. A punch-through reference diode comprising:
a semiconductor body;
a first semiconductor region of a first conductivity type which is formed within said semiconductor body;
a second semiconductor region of a second conductivity type which is formed within said semiconductor body, said second semiconductor region adjoining said first semiconductor region and defining a first PN-junction with said first semiconductor region; and
a third semiconductor region of said first conductivity type which is formed within said semiconductor body, said third semiconductor region adjoining said second semiconductor region and defining a second PN-junction with said second semiconductor region, whereby said second semiconductor region is located between said first PN-junction and said second PN-junction;
wherein said second semiconductor region has an impurity concentration distribution in which a concentration of an impurity of said second conductivity type increases from said first PN-junction towards said second PN-junction; said first and second semiconductor regions are provided with a connection for electrically connecting them in order to short said first PN-junction; said first and third semiconductor regions are respectively provided with connections for supplying a voltage so as to reverse-bias said second PN-junction; and a Zener breakdown voltage of said second PN-junction is greater than a punch-through voltage between said first and third semiconductor regions.

2. A punch-through reference diode according to claim 1, wherein said first and third semiconductor regions are of the P-type, and said second semiconductor region is of the N-type.

3. A punch-through reference diode according to claim 2, wherein said first semiconductor region consists of a P-type substrate which is heavily doped, and an epitaxial layer which is formed on said substrate and which is lightly doped, and wherein said epitaxial layer adjoins said second semiconductor region so as to form said first PN-junction with said second semiconductor region.

4. A punch-through reference diode according to claim 3, wherein said second semiconductor region is doped with an impurity selected from the group consisting of antimony and arsenic, while said third semiconductor region is doped with an impurity of boron.

5. A punch-through reference diode according to claim 1, wherein said semiconductor body comprises:
a first semiconductor layer of said first conductivity type having a relatively high impurity concentration ahd having first and second surfaces; and
a second semiconductor layer disposed on said second surface of said first semiconductor layer and being comprised of said first, second, and third semiconductor regions, said second semiconductor layer having a first surface contacted with said second surface of said first semiconductor layer and a second surface opposite to said first surface of said second semiconductor layer.

6. A punch-through reference diode according to claim 1, wherein said semiconductor body has first and second surfaces and is comprised of said first, second, and third semiconductor regions, said first semiconductor region extending to both said first and second surfaces, said second and third semiconductor regions extending to said first surface.

7. A punch-through reference diode according to claim 5, wherein an electrode is provided in the first surface of said first semiconductor layer, and said connection is comprised of an annular-shaped ring electrode disposed on the second surface of said second semiconductor layer.

8. A punch-through reference diode according to claim 6, wherein said connection comprises an electrode in contact with said first and second semiconductor regions at the first surface of said semiconductor body.

9. A punch-through reference diode according to claim 1, wherein the thickness of said second semiconductor region is smaller than the thickness of said first semiconductor region.

10. A punch-through reference diode according to claim 6, wherein said semiconductor body further comprises a fourth semiconductor region of said first conductivity type and having relatively low impurity concentration, said fourth semiconductor region being buried within said semiconductor body by being disposed between said first and second semiconductor regions.

11. A punch-through reference diode according to claim 5, further comprising a fourth semiconductor region, of said first conductivity type and having a relatively high impurity concentration, surrounding and adjoining said second semiconductor region and extending from the second surface of said second semiconductor layer to the second surface of said first semiconductor layer.

12. A punch-through reference diode according to claim 11, further comprising a fifth semiconductor region, of said second conductivity type ahd having a relatively high impurity concentration, extending from said second surface of said second semiconductor layer and being contiguous with said second semiconductor region and said fourth semiconductor region.

13. A punch-through reference diode according to claim 12, wherein said connection comprises an electrode in ohmic contact, at the second surface of said second semiconductor layer, with said fourth and fifth semiconductor regions.

14. A punch-through reference diode according to claim 13, further comprising a bump-shaped electrode structure in ohmic contact with said third semiconductor region and extending over and beyond the intersection of said second PN-junction at the second surface of said semiconductor layer.

15. A punch-through reference diode according to claim 14, wherein said first semiconductor layer and said first, third and fourth semiconductor regions are of the P-type, and said second and fifth semiconductor regions are of the N-type.

16. A punch-through reference diode according to claim 15, wherein said bump-shaped electrode structure is made of silver.

17. A punch-through reference diode constructed of a three-layer transistor device, comprising:
  a semiconductor body;
  a first semiconductor region of a first conductivity type which is formed within said semiconductor body to form a collector of said transistor;
  a second semiconductor region of a second conductivity type which is formed within said semiconductor body to form a base of said transistor, said second semiconductor region adjoining said first semiconductor region and defining a base-collector PN-junction with said first semiconductor region; and
  a third semiconductor region of said first conductivity type which is formed within said semiconductor body to form an emitter of said transistor, said third semiconductor region adjoining said second semiconductor region and defining a base-emitter PN-junction with said second semiconductor region, whereby said second semiconductor region is located between said base-collector PN-junction and said base-emitter PN-junction;
  wherein said second semiconductor region has an impurity concentration distribution in which the concentration of an impurity of said second conductivity type increases from said base-collector PN-junction towards said base-emitter PN-junction, and said first and second semiconductor regions are provided with a connection for electrically connecting them in order to short said base-collector PN-junction; and
  means for supplying a voltage to said first and third semiconductor regions to reverse-bias said base-emitter PN-junction to form a depletion layer in said second semiconductor region so that transistor operation of said three-layer transistor device is prevented while a punch-through operation is permitted between said first semiconductor region and said third semiconductor region when a reverse-bias voltage exceeding a predetermined punch-through voltage is applied to the base-emitter PN-junction to extend said depletion layer from said first semiconductor layer to said third semiconductor layer.

18. A punch-through reference diode, comprising:
  a first semiconductor layer of P conductivity type having a relatively high impurity concentration and having first and second surfaces; and
  a second semiconductor layer disposed on said second surface of said first semiconductor layer, said second semiconductor layer having a first surface contacted with said second surface of said first semiconductor layer and a second surface opposite to said first surface of said second semiconductor layer, said second semiconductor layer comprising:
    p2 a first semiconductor region of P conductivity type having an impurity concentration less than that of said first semiconductor region being in contact with the second surface of said first semiconductor layer;
    a second semiconductor region of N conductivity type, said second semiconductor region adjoining said first semiconductor region and defining a first PN-junction with said first semiconductor region;
    a third semiconductor region of P conductivity type, said third semiconductor region adjoining said second semiconductor region and defining a second PN-junction with said second semiconductor region, whereby said second semiconductor region is located between said first PN-junction and said second PN-junction;
    a ring-shaped fourth semiconductor region, of P conductivity type and having a relatively high impurity concentration, surrounding and adjoining said second semiconductor region and extending from the second surface of said second semiconductor layer to the second surface of said first semiconductor layer;
    a ring-shaped fifth semiconductor region, of N conductivity type and having a relatively high impurity concentration, extending from said second surface of said second semiconductor layer and being contiguous with said second semiconductor region and said fourth semiconductor region;
    a ring-shaped electrode in ohmic contact, at the second surface of said second semiconductor layer, with said fourth and fifth semiconductor regions to short said first PN-junction;
    a bump-shaped electrode structure in ohmic contact with said third semiconductor region and extending over and beyond the intersection of said second PN-junction at the second surface of said second semiconductor layer;
  wherein said second semiconductor region has an impurity concentration distribution in which the concentration of an impurity of said second conductivity type increases from said first PN-junction towards said second PN-junction;
  said first and third semiconductor regions are respectively provided with connections for supplying a voltage so as to reverse-bias said second PN-junction; and
  a Zener breakdown voltage of said second PN-junction is greater than a punch-through voltage between said first and third semiconductor regions.

19. A punch-through reference diode according to claim 18, wherein said bump-shaped electrode structure is made of silver.

* * * * *